(12) United States Patent
Sasa et al.

(10) Patent No.: US 6,334,782 B1
(45) Date of Patent: Jan. 1, 2002

(54) PRINTED-CIRCUIT BOARD

(75) Inventors: Motokazu Sasa; Yoshiaki Suzuki, both of Ibaraki; Yosuke Kanemoto, Tokyo, all of (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 09/381,662

(22) PCT Filed: Jan. 28, 1999

(86) PCT No.: PCT/JP99/00348

§ 371 Date: Sep. 20, 1999

§ 102(e) Date: Sep. 20, 1999

(87) PCT Pub. No.: WO99/39555

PCT Pub. Date: Aug. 5, 1999

(30) Foreign Application Priority Data

Jan. 29, 1998 (JP) ...................................... 10-32236

(51) Int. Cl.$^7$ ................... H05K 1/00; H05K 1/16
(52) U.S. Cl. ............... 439/83; 174/260; 174/261
(58) Field of Search .................... 174/250, 261, 174/138 E, 138 G; 439/83, 80, 78

(56) References Cited

U.S. PATENT DOCUMENTS

| 4,303,291 A | * | 12/1981 | Dines ............................... 29/843 |
| 5,315,070 A | * | 5/1994 | Maiward ........................ 174/250 |
| 5,386,087 A | * | 1/1995 | Lee et al. ....................... 174/261 |
| 5,965,843 A | * | 10/1999 | Schönberger et al. ..... 174/35 R |
| 6,133,534 A | * | 10/2000 | Fukutami et al. ............ 174/257 |

FOREIGN PATENT DOCUMENTS

| JP | 55-96675 | 7/1980 |
| JP | 60-61754 | 4/1985 |
| JP | 64-50595 | 2/1989 |
| JP | 6-38272 | 5/1994 |
| JP | 7-18463 | 3/1995 |

\* cited by examiner

Primary Examiner—Kamand Cuneo
(74) Attorney, Agent, or Firm—Pearne & Gordon LLP

(57) ABSTRACT

A protective wall 11 higher than conductive circuit patterns 10, 12, 13, 14 and 15 is formed so that it extends between adjacent patterns. Even if metal powder by fretting corrosion appears, the resist layer 11 prevents it from scattering and shorting the electrically isolated conductive circuit patterns. Thus, the printed-circuit board of the present invention is free from malfunctions of the electronic parts and damage thereto.

5 Claims, 4 Drawing Sheets

PRINTED-CIRCUIT BOARD

BACKGROUND OF THE INVENTION

1. Field of the Invention

The present invention relates to a printed-circuit board with conductive circuit patterns formed thereon for electric connections to electronic parts.

2. Description of the Related Art

FIG. 5 depicts a conventional printed-circuit board 100 on which there are merely formed electrically isolated conductive circuit patterns 101.

On the other hand, since tin and lead in solder have a harmful effect on the human body and cause environmental destruction when the printed-circuit boards are disposed of, a jack 103 is used to provide electric connections by pressure contact without the use of the solder.

As shown in FIGS. 5 through 7, the jack 103 has an insulating housing 105, a cylindrical portion 107 formed integrally therewith and having a plug insertion hole 106, and terminals 104 partly projecting down through the bottom of the insulating housing 105, the projecting portions being bent so that they are resiliently deformable in the vertical direction in FIG. 5.

The jack 103 has its insulating housing 105 fixed to a case of equipment (not shown). By fixing the printed-circuit board 100 to the case, the terminals 104 are pressed against the conductive circuit patterns 101 of the board 100 to establish electric connections therebetween.

With such a printed-circuit board 100, electric signals from a plug (not shown) inserted in the plug insertion hole 106 are applied via the terminals 104 to the conductive circuit patterns 101, through which they are provided to other electric parts (not shown) connected to the patterns 101. Alternatively, electric signals transmitted through the conductive circuit patterns 101 are fed to the plug received in the plug insertion hole 106.

Since the connection between the terminals 104 of the jack 103 and the conductive circuit patterns 101 depends on the pressure contact, not the soldering, what is called fretting (or chafing) corrosion is caused by vibrations or shocks. That is, the conductive circuit patterns 101 are ablated by the terminals 104 to form metal powder, which shorts the electrically isolated conductive circuit patterns 101, causing electronic parts associated therewith to malfunctions or damage to them.

SUMMARY OF THE INVENTION

It is therefore an object of the present invention to provide a printed-circuit board which ensures preventing malfunctions of electronic parts and damage thereto.

The printed-circuit board according to the present invention is characterized in that desired conductive circuit patterns formed thereon are separated by protection or partition walls higher than the circuit patterns.

With terminals of electronic parts connected to the conductive circuit patterns, electric signals from the former are applied to the latter and vice versa.

In the event that metal powder results from fretting corrosion, it is prevented by the protective walls from shorting the conductive circuit patterns.

DETAILED DESCRIPTION OF THE PREFERRED EMBODIMENTS

Figure 1:
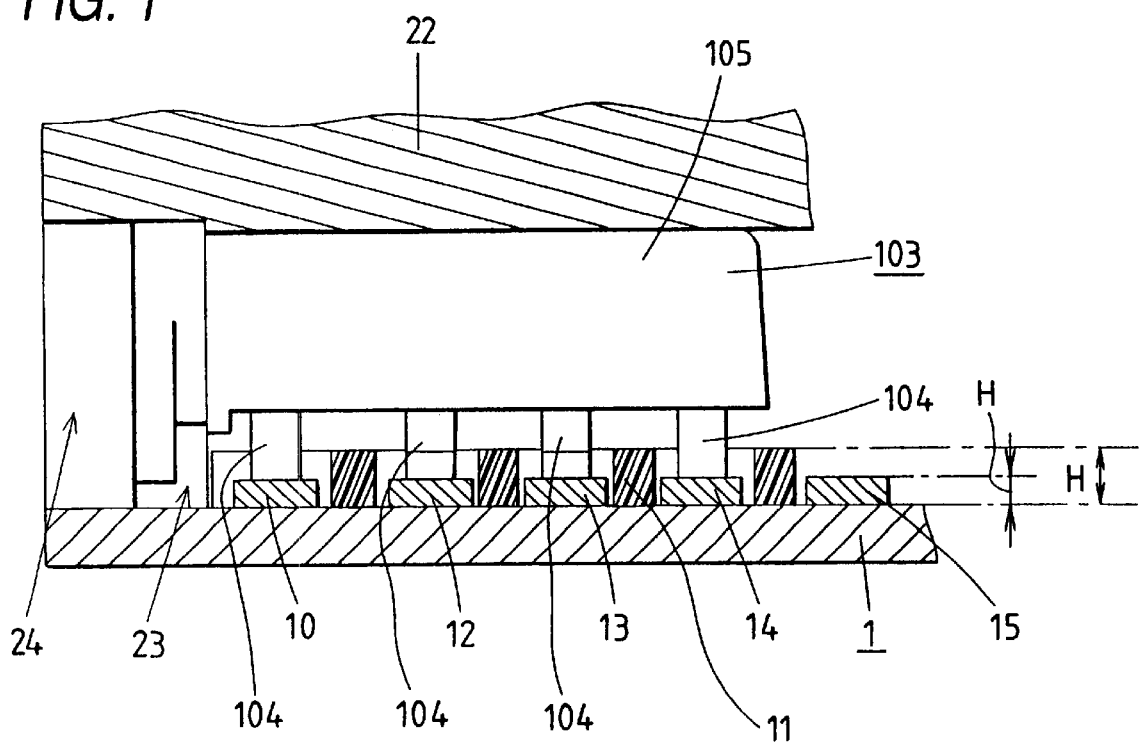
FIG. 1 is a diagram illustrating a printed-circuit board 1 according to a first embodiment of the invention with a jack 103 mounted thereon.
Figure 2:
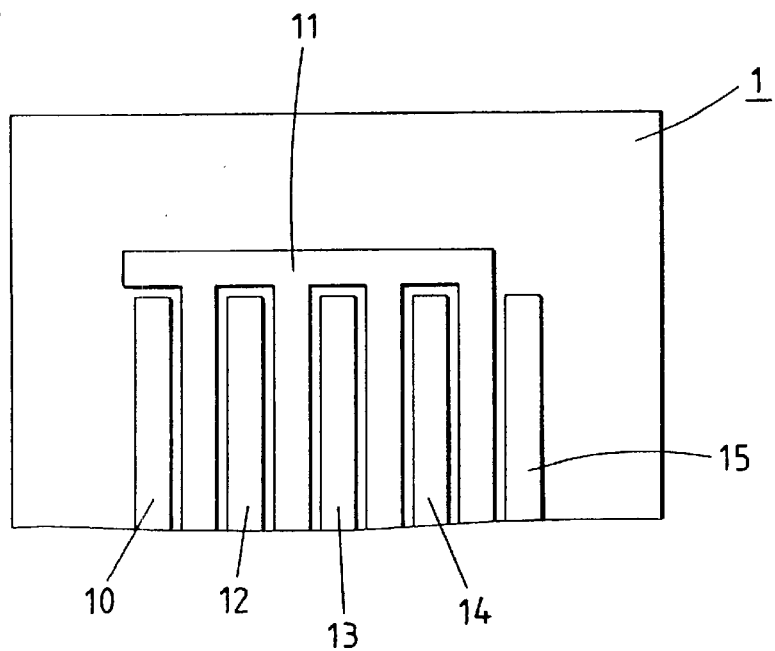
FIG. 2 is a plan view of the printed-circuit board 1 depicted in FIG. 1.

FIGS. 1 and 2 schematically illustrate a first embodiment of the present invention, FIG. 1 being a diagram depicting a printed-circuit board 1 with the jack 103 mounted thereon and FIG. 2 a diagrammatic showing of the printed-circuit board 1. A detailed description will be given, with reference to the accompanying drawings, of embodiments of the present invention.

The printed-circuit board 1 has conductive circuit patterns 10, 12, 13, 14 and 15 printed thereon in desired forms as depicted in FIG. 2. The conductive circuit patterns 10, 12, 13, 14 and 15 are electrically isolated from one another.

On the printed-circuit board 1 there is also formed a resist layer 11 surrounding the conductive circuit patterns 10, 12, 13 and 14. The resist layer 11 has a one-piece structure, which has a height H greater than those H' of the conductive circuit patterns 10, 12, 13, 14 and 15 as depicted in FIG. 1.

In the case of connecting the jack 103 of the same shape as in the conventional example to the printed-circuit board 1, the cylindrical portion 107 of the jack 103 is inserted in a U-shaped groove 23 of an equipment case 22 with the plug insertion hole 106 exposed to the outside through an opening 24 of the case 22, and the insulating housing 105 is fixed to the case 22. Next, the printed-circuit board 1 is mounted on the case 22, by which the terminals 104 of the jack 103 and the conductive circuit patterns 10, 12, 13 and 14 are pressure contacted to establish electric connections therebetween. The conductive circuit pattern 15 is not connected to any one of the terminals 104, but it is connected to a different electronic part (not shown).

In the printed-circuit board 1 with the jack 103 thus mounted thereon, electric signals from a plug (not shown) received in the plug insertion hole 106 are transmitted via the terminals 104 to the conductive circuit patterns 10, 12, 13 and 14. Similarly, electric signals from the conductive circuit patterns 10, 12, 13 and 14 are conveyed to the plug via the terminals 104 of the jack 103.

Even if metal powder is generated due to fretting corrosion, the resist layer 11 prevents it from fly-off and shorting the electrically isolated conductive circuit patterns 10, 12, 13, 14 and 15.

With such a printed-circuit board 1, even if metal powder by fretting corrosion appears on the conductive circuit patterns 10, 12, 13 and 14, the resist layer 11 blocks it from scattering, and hence prevents their shorting. Thus, there is no possibility of such metal powder causing malfunctions of the electric parts and damage thereto.

Figure 3:
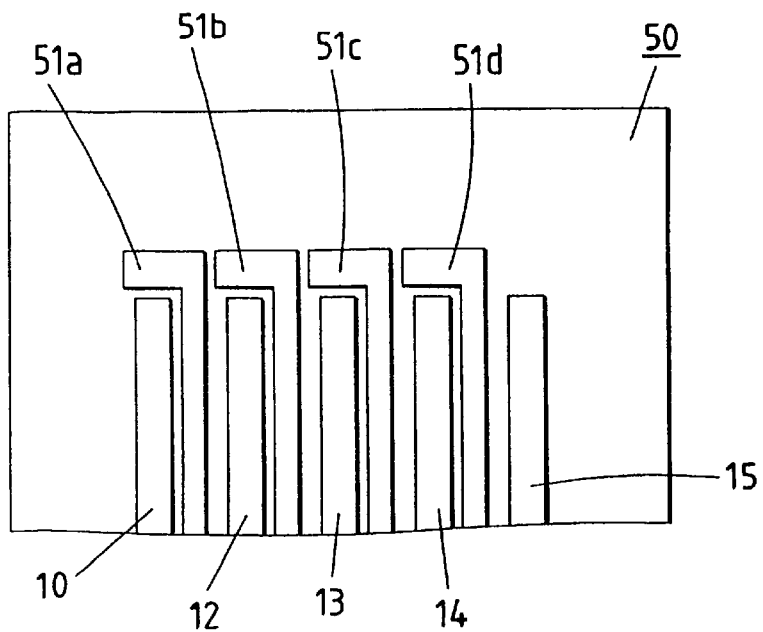
FIG. 3 is a plan view of a printed-circuit board 50 according to a second embodiment of the present invention.

FIG. 3 illustrates a second embodiment of the present invention, in which there are formed on a printed-circuit board 50 independent or separate resist layers 51a, 51b, 51c and 51d surrounding the conductive circuit patterns 10, 12, 13 and 14, respectively. This embodiment is identical in construction with the first embodiment except the above; hence, no description will be repeated.

Figure 4:
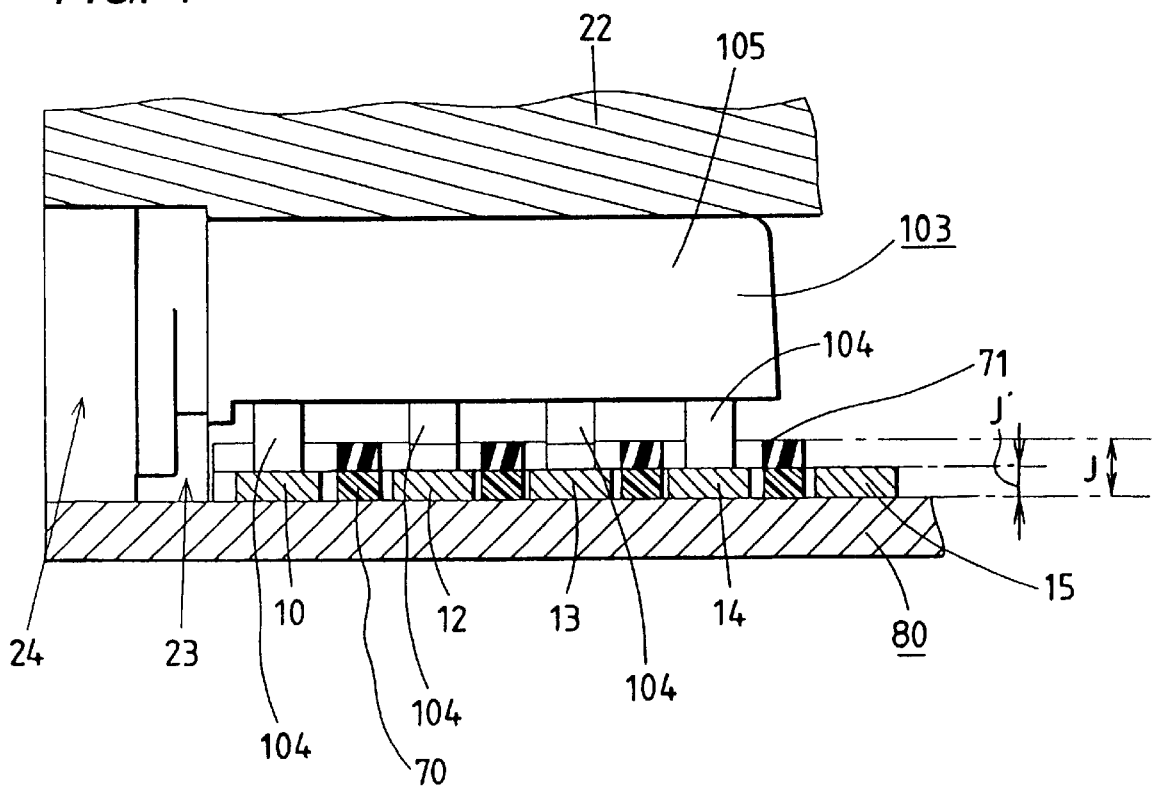
FIG. 4 is a diagram depicting a printed-circuit 80 board according to a third embodiment of the present invention with a jack 103 mounted thereon.
Figure 5:
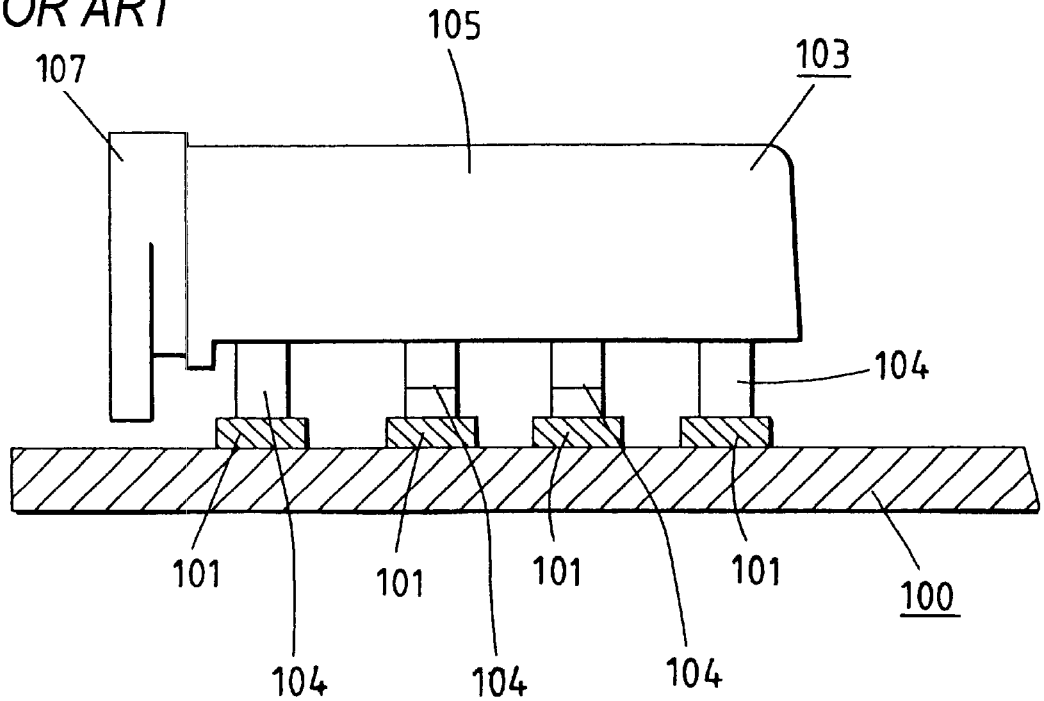
FIG. 5 is a diagram showing a conventional printed circuit board 100 with a jack 103 mounted thereon.
Figure 6:
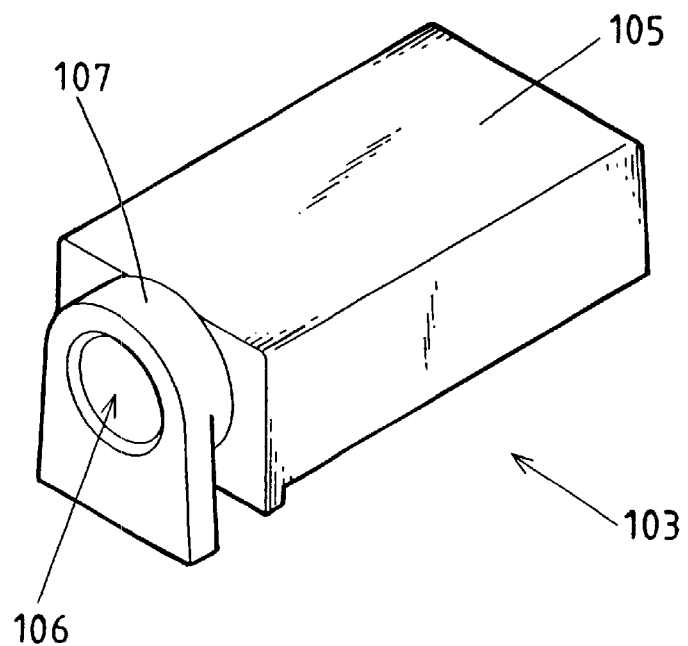
FIG. 6 is a perspective view of the jack 103.
Figure 7:
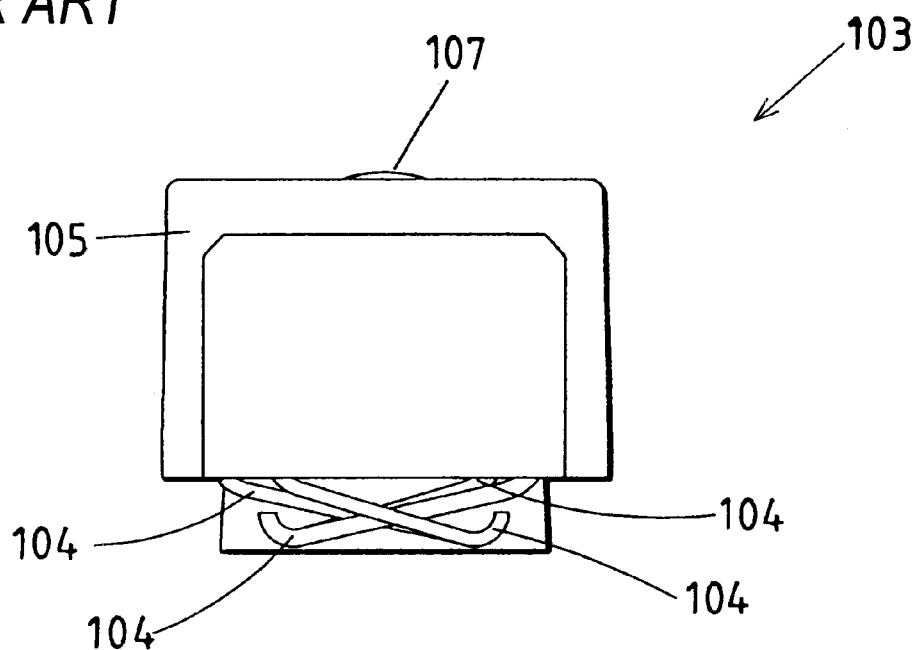
FIG. 7 is a rear view of the jack 103.

FIG. 4 illustrates a third embodiment of the present invention, which is common to the first embodiment in the formation of a resist layer 70 on a printed-circuit board 80 in such a manner that it surrounds the conductive circuit patterns 10, 12, 13 and 14. In this embodiment, however, the resist layer 70 is formed to have substantially the same height as those of the conductive circuit patterns 10, 12, 13 and 14, and is overlaid with a silk screen layer 71 by screen printing. The silk screen layer 71 can be formed at the same time as characters or letters are printed on the board 80. Hence, the height J, which is the sum of the heights of the resist layer 70 and the silk screen layer 71, is larger than the height J' of each conductive circuit pattern. In this instance, too, the resist layer 70 and the silk screen layer 71 may be formed as a single structure as in the first embodiment, or may be formed separately for each circuit pattern as in the second embodiment.

The present invention is not limited specifically to the embodiments described above, and various modifications and variation are possible. While in the above the jack 103 has been described to be connected to the conductive circuit patterns, it may be substituted with a connector, switch or similar electronic part. In short, the operation/working effect of the present invention is produced in the case where electronic parts are pressure contacted to the circuit patterns instead of soldering. Although in the above the conductive circuit patterns 10, 12, 13, 14 and 15 have been described to have the same height, they need not be formed to the same height but may be formed to different heights as long as they are lower than the resist layer. Besides, the resist layers 11, 51a, 51b, 51c, 51d, 70 and the silk screen layer 71 have been described to be formed as a unitary structure or separately of one another, but they may be formed in any shapes as long as they surround the conductive circuit patterns 10, 12, 13 and 14.

Industrial Applicability

As described above, the present invention is effectively applicable to a printed-circuit board in which the electric connection of conductive circuit patterns formed thereon to terminals of electronic components relay on pressure contact, not soldering, and in particular suitable for avoiding a short-circuit between the electrically isolated conductive patterns on a printed-circuit board in case where metal powder is caused due to fretting corrosion.

What is claimed is:

1. A printed circuit board with desired conductive circuit patterns formed thereon, wherein:

a protective wall higher than said conductive circuit patterns is formed between adjacent patterns;

said protective wall is formed of a resist layer or a combination of the resist layer and a silk screen layer; and terminals of an electronic part or electronic parts are in pressure contact with said adjacent patterns.

2. The printed circuit board according to claim 1, wherein said protective wall prevents shorting or said adjacent patterns caused by metal powders generated due to fretting corrosion.

3. The printed circuit board according to claim 1, further comprising:

means for mounting said electronic part or electronic parts onto said printed circuit board so that said terminals are in pressure contact with said adjacent patterns without the use of soldering.

4. The printed circuit board according to claim 3, wherein said means permits a minute sliding motion between said terminals and said adjacent patterns.

5. The printed circuit board according to claim 1, further comprising:

means for mounting said electronic part or electronic parts onto said printed circuit board to permit a minute sliding motion between said terminals and said adjacent patterns while establishing an electric connection therebetween.

* * * * *

UNITED STATES PATENT AND TRADEMARK OFFICE
CERTIFICATE OF CORRECTION

PATENT NO.   : 6,334,782 B1
DATED        : January 1, 2002
INVENTOR(S)  : Motokazu Sasa et al.

It is certified that error appears in the above-identified patent and that said Letters Patent is hereby corrected as shown below:

<u>Column 2,</u>
Line 8, please delete "printed circuit" and insert therefor -- printed-circuit --; and <u>Column 4,</u>
Line 20, please delete "or" and insert therefor -- of --.

Signed and Sealed this

Twenty-eighth Day of May, 2002

Attest:

JAMES E. ROGAN
*Director of the United States Patent and Trademark Office*

*Attesting Officer*